(12) United States Patent
Miao et al.

(10) Patent No.: US 10,884,060 B1
(45) Date of Patent: Jan. 5, 2021

(54) DYNAMIC PARAMETER ESTIMATION OF GENERATORS

(71) Applicants: Zhixin Miao, Tampa, FL (US); Lingling Fan, Tampa, FL (US)

(72) Inventors: Zhixin Miao, Tampa, FL (US); Lingling Fan, Tampa, FL (US)

(73) Assignee: University of South Florida, Tampa, FL (US)

( * ) Notice: Subject to any disclaimer, the term of this patent is extended or adjusted under 35 U.S.C. 154(b) by 129 days.

(21) Appl. No.: 16/227,730

(22) Filed: Dec. 20, 2018

Related U.S. Application Data

(62) Division of application No. 13/968,693, filed on Aug. 16, 2013, now Pat. No. 10,234,508.

(60) Provisional application No. 61/684,262, filed on Aug. 17, 2012.

(51) Int. Cl.
*G01R 31/34* (2020.01)

(52) U.S. Cl.
CPC .................................. *G01R 31/343* (2013.01)

(58) Field of Classification Search
CPC .................................................... G01R 31/343
See application file for complete search history.

(56) References Cited

U.S. PATENT DOCUMENTS

| | | | |
|---|---|---|---|
| 5,144,564 A | 9/1992 | Naidu et al. | |
| 6,005,364 A | 12/1999 | Acarnley | |
| 6,441,572 B2 | 8/2002 | Batzel | |
| 6,653,829 B1 | 11/2003 | Henry et al. | |
| 7,299,708 B2 | 11/2007 | Ho | |
| 2005/0137834 A1 | 6/2005 | Heydt et al. | |
| 2010/0049455 A1 | 2/2010 | Scholtz et al. | |
| 2013/0241746 A1* | 9/2013 | McKinley | G01D 4/002 340/870.02 |
| 2014/0032138 A1* | 1/2014 | Shrestha | G01R 31/40 702/58 |
| 2014/0340236 A1* | 11/2014 | Rhoads | G08C 19/12 340/870.02 |

OTHER PUBLICATIONS

Fan et al, "Extended Kalman filtering based real-time dynamic state and parameter estimation using PMU data", 2013. (Year: 2013).*
Z. Huang et al. "Application of extended kalman filter techniques for dynamic model parameter calibration", IEEE Power & Energy General Meeting, Jul. 2009.
E. Ghahremani et al. "Dynamic state estimation in power system by applying the extended kalman filter with unknown inputs to phasor measurements", IEEE Trans. Power Systems, 26:4:2011.

(Continued)

*Primary Examiner* — Regis J Betsch
*Assistant Examiner* — Jeremy A Delozier
(74) *Attorney, Agent, or Firm* — Thomas | Horstemeyer, LLP

(57) ABSTRACT

Various examples are provided extended Kalman filtering estimators for generators. In one example, among others an extended Kalman filtering estimator includes a dynamics estimator configured to calculate an estimated variable such as an estimated dynamic state or an estimated parameter of a generator, a geometry estimator configured to estimate generator values, and a Kalman filter component configured to determine a correction to the estimated state variable.

20 Claims, 9 Drawing Sheets

(56) References Cited

OTHER PUBLICATIONS

Kyriakides et al. "Estimation of Synchronous Generator Parameters Using an Observer for Damper Currents and a Graphical User Interface", Energy Conversion, IEEE Transactions on, 19:3:2004.
Final Office Action dated Sep. 7, 2018 (U.S. Appl. No. 13/968,693.
Non-Final Office Action dated Jan. 24, 2018 (U.S. Appl. No. 13/968,693).
Final Office Action dated Sep. 21, 2017 (U.S. Appl. No. 13/968,693).
Non-Final Office Action dated Feb. 9, 2017 (U.S. Appl. No. 13/968,693).

\* cited by examiner

DYNAMIC PARAMETER ESTIMATION OF GENERATORS

CROSS REFERENCE TO RELATED APPLICATIONS

This application claims priority to and the benefit of the following applications, as a divisional of co-pending U.S. patent application Ser. No. 13/968,693, filed on Aug. 16, 2013, and entitled "DYNAMIC PARAMETER ESTIMATION OF GENERATORS," which claims priority to and the benefit of U.S. provisional application No. 61/684,262, filed on Aug. 17, 2012, and entitled "DYNAMIC PARAMETER ESTIMATION OF SYNCHRONOUS GENERATORS," each of which is hereby incorporated by reference in its entirety.

STATEMENT REGARDING FEDERALLY SPONSORED RESEARCH OR DEVELOPMENT

This invention was made with government support under agreement DE-OE0000369, awarded by the Department of Energy. The Government has certain rights in the invention.

BACKGROUND

Various parameters can be used to model the operation of generators connected to a power distribution system. It is desirable to measure the parameters of a generator that is, for example, used in a power plant connected to an electrical power grid. Unfortunately, the measurement of such parameters is only possible when the generator is taken offline. Accordingly, it can be appreciated that it would be desirable to measure such parameters in real time without having to take the generator offline.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
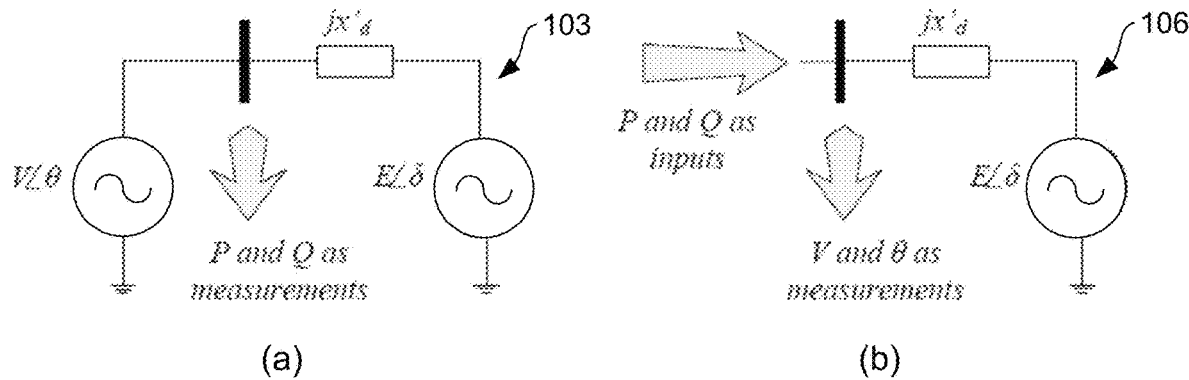
FIG. 1 shows graphical representations of examples of model decoupling using (a) voltage magnitude (V) and voltage phase angle (θ) as inputs and real power (P) and reactive power (Q) as measurements and (b) P and Q as inputs while V and θ as measurements in accordance with various embodiments of the present disclosure.

Disclosed herein are various examples of dynamic parameter estimation of generators such as, e.g., synchronous generators. Reference will now be made in detail to the description of the embodiments as illustrated in the drawings, wherein like reference numbers indicate like parts throughout the several views.

As described above, it may be desirable to measure generator parameters in real time without having to take the generator offline. As is disclosed herein, such parameters can be estimated using extended Kalman filtering based upon data collected by a phasor measurement unit (PMU) of the type often used to measure the electrical conditions on an electrical power grid. In some embodiments, extended Kalman filtering can be used to estimate one or more of the rotor angle, rotor speed, inertia constant, damping factor, mechanical power, and/or transient reactance of the generator.

Extended Kalman filtering (EKF) based real-time dynamic state and parameter estimation is described using data obtained from one or more phasor measurement units (PMUs). In order to reduce computing load of the estimation system, a model decoupling technique can be used in which the measurements from a PMU are treated as inputs to and outputs from the power system or grid. EKF can be implemented using a second order swing equation and a classical generator model to estimate the two dynamic states (rotor angle and rotor speed) and other unknown parameters such as, e.g., mechanical power, inertia constant, damping factor, and transient reactance.

PMUs equipped with GPS antennas, and installed at various locations throughout the power system, measure three-phase instantaneous voltages and currents and calibrate phasors, which may be called synchrophasors. The synchrophasors can be transmitted with time stamps for use by the parameter estimation system. Synchrophasors have many applications that enhance situation awareness of the power grid. Effective use of the PMU data to enhance power system situation awareness is of key interest to power system operators. For example, the PMU data may be employed for dynamic state and parameter estimation.

Conventional state estimation estimates bus voltages and phase angles every five minutes and handles steady state power flow problems. In contrast, a real time dynamics monitoring system (RTDMS) can be used to collect data (e.g., from the Eastern Interconnection power grid) for the RTDMS database at a 30 Hz sampling rate. This is a much faster sampling rate than that of the conventional state estimation (i.e., a 0.2 Hz sampling rate). At such a sampling rate, estimation of dynamic states and parameters related to low frequency electromechanical dynamics is feasible.

Electromechanical dynamics are among the leading causes of power system reliability problems. Accurate estimation of the system states and parameters can be used for system model validation. Real-time estimation can also be used to predict system stability and may be used by controllers (e.g., oscillation damping controllers installed in flexible AC transmission systems (FACTS) and high voltage direct current (HVDC) systems) to provide control signals and/or to adjust control activities.

Kalman filtering can be applied to power system measurements. Kalman filtering may be used to identify fundamental voltage magnitude, harmonic injections, frequency deviation and rate of change, etc. Compared to discrete Fourier transformation (DFT), which uses a time window of sampling data, Kalman filtering recursively develops an estimate at every time step. In electric machines, Kalman filtering technology can be used to estimate synchronous generator machine circuit parameters and states. Kalman filtering technology can also be used in wind speed estimation and doubly-fed induction generator model parameter estimation. Instead of estimating an entire power system with hundreds of generators, extended Kalman filtering (EKF) based estimation for subsystems is more appealing to reduce the computing burden.

A model decoupling method is described that implements EKF to estimate the dynamic states and parameters related to electromechanical dynamics of a generator. The method is beneficial because it may provide a comprehensive estimate (two states and four unknown parameters can be estimated) and is the simplest for a synchronous generator.

Kalman filter theory can be considered as a type of observer for linear dynamic systems perturbed by white noise using white noise polluted measurements. The Kalman filter is suitable for real-time estimation because the estimation is performed for any instantaneous time. Extended Kalman filtering (EKF) is a discrete Kalman filter adapted to nonlinear system estimation through linearization. A nonlinear dynamic system may be described by the differential algebraic equations:

$$\begin{cases} \dfrac{dx}{dt} = f_c(x, y, u, w) \\ 0 = g_c(x, y, u, v) \end{cases} \quad \text{(EQN. 1)}$$

where the x vector represents the state variables, the y vector represents the algebraic variables, u is the vector of input variables, and w and v are processing noise and measurement noise, respectively. The subscript "c" denotes the continuous form. The discrete form of EQN. 1 is as follows:

$$\begin{cases} x_k = x_{k-1} + f_c(x_{k-1}, u_{k-1}, w_{k-1})\Delta t \\ \equiv f(x_{k-1}, u_{k-1}, w_{k-1}) \\ 0 = g_c(x_k, y_k, u_k, v_k) \Rightarrow y_k = h(x_k, u_k, v_k) \end{cases} \quad \text{(EQN. 2)}$$

For the nonlinear dynamic system described by the differential algebraic equations in EQN. 1 and further in their discrete form in EQN. 2, the purpose of EKF is to minimize the covariance of the mismatch between the estimated states and measured states.

The EKF problem can accommodate parameter estimation by adding "auxiliary states" where $x_k = x_{k-1}$. The EKF problem can be solved in a two-step process described by the following:

$$\text{Prediction:} \begin{cases} \hat{x}_k^- = f(\hat{x}_{k-1}, h(\hat{x}_{k-1}, u_{k-1}), u_{k-1}, 0) \\ P_k^- = A_k P_{k-1} A_k^T + W_k Q_{k-1} W_k^T \end{cases} \quad \text{(EQN. 3)}$$

$$\text{Correction:} \begin{cases} K_k = P_k^- H_k^T (H_k P_k^- H_k^T + V_k R_k V_k^T)^{-1} \\ \hat{x}_k = \hat{x}_k^- + K_k(z_k - h(\hat{x}_k^-, u_k, 0)) \\ P_k = (I - K_k H_k) P_k^- \end{cases} \quad \text{(EQN. 4)}$$

where the superscript — denotes a priori state, $A_k$ and $W_k$ are the process Jacobians at step k, $Q_k$ is the process noise covariance at step k, $H_k$ and $V_k$ are the measurement Jacobians at step k, $R_k$ is the measurement noise covariance at step k, and where:

$$A = \frac{\partial f}{\partial x}, H = \frac{\partial h}{\partial x}, W = \frac{\partial f}{\partial w}, V = \frac{\partial h}{\partial v}. \quad \text{(EQN. 5)}$$

Model Decoupling and EKF Implementation

The technique used in subsystem model validation (called "event play back") has the potential to decouple the EKF problem by better use of the PMU data. One group of PMU data is treated as the input signals to the dynamic model and the other group is treated as the measurements in the EKF problem. Using such a technique, there is no longer the need to deal with the dynamic model of the entire power system. Rather, small-scale dynamic models can be used in parallel. The data from each PMU can include four categories of data: voltage magnitude (V), voltage phase angle (θ), real power (P) and reactive power (Q).

The dynamic model of each generator (which are modeled as a constant voltage behind a transient reactance) can be expressed as follows:

$$\begin{cases} \dfrac{d\delta}{dt} = \omega - \omega_0 \\ \dfrac{d\omega}{dt} = \dfrac{\omega_0}{2H}(P_m - P_e - D(\omega - \omega_0)) \\ \qquad = \dfrac{\omega_0}{2H}\left(P_m - \dfrac{EV}{x'_d}\sin(\delta - \theta) - D(\omega - \omega_0)\right) \end{cases}$$ (EQN. 6)

The vector of the state variables is $x=[\delta, \omega]^T$ ($\delta$ is the rotor angle and w is the rotor speed). E is the internal voltage and $P_m$ is the mechanical power. Each generator's model is coupled with other generators' models through electric power $P_e$.

There are two ways (method A and method B) to decouple the model of the generator using the PMU measurements. Method A treats the terminal voltage phasor (V and $\theta$) as the input signal and the real and reactive power (P and Q) as the measurements. Method B treats the real and reactive power as input signals and the voltage phasor values as the measurements. FIG. 1 shows graphical representations of (a) a model 103 using V and $\theta$ as inputs and using P and Q as measurements; and (b) a model 106 using P and Q as inputs and using V and $\theta$ as measurements.

The relationship of P, Q, V and $\theta$, and other state variables can be found in the following:

$$\begin{cases} P = \dfrac{EV}{X'_d}\sin(\delta - \theta) \\ Q = \dfrac{-V^2 + EV\cos(\delta - \theta)}{X'd} \end{cases}$$ (EQN. 7)

EQN. 7 defines the geometry. A significant difference between method A and method B resides in the prediction step rotor speed computation.

Method A: (EQN. 8)

$$\omega_{k+1} = \dfrac{\omega_0}{2H_k}\left(P_{m,k} - \dfrac{EV_k\sin(\delta_k - \theta_k)}{x'_{d,k}} - D_k\left(\dfrac{\omega_k}{\omega_0} - 1\right)\right)\Delta t + w_k$$

Method B:

$$\omega_{k+1} = \omega_k + \dfrac{\omega_0}{2H_k}\left(P_{m,k} - P_{e,k} + D_k\left(\dfrac{\omega_k}{\omega_0} - 1\right)\right)\Delta t$$

Figure 2:
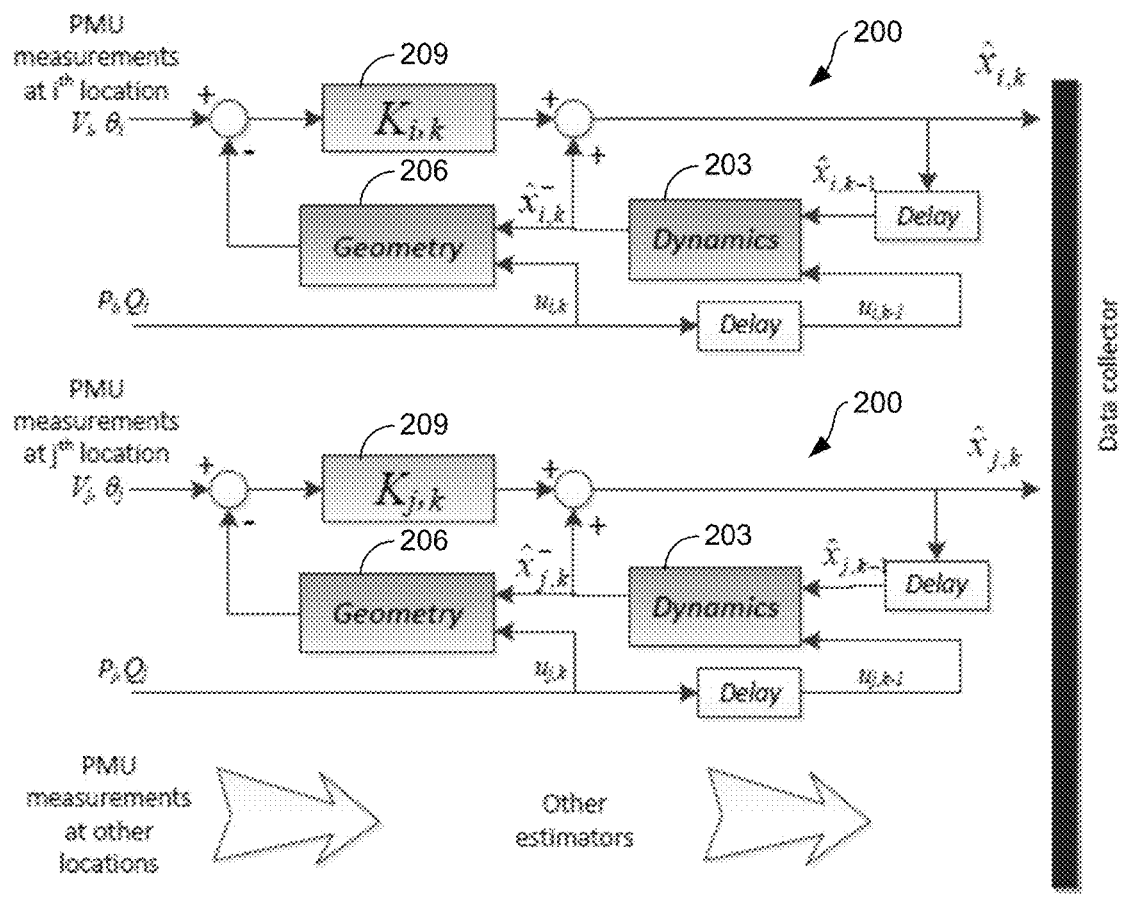
FIG. 2 is a graphical representation of an example of extended Kalman filtering (EKF) estimation using PMU data in accordance with various embodiments of the present disclosure.

Method A relies on the voltage measurement, phase angle measurement, and transient reactance estimation to compute the electric power in the prediction step. The expression for power is only accurate for a classical generator model. In addition, when the transient reactance is unknown, there will be significant errors in computing power. In contrast to method A, method B uses the power measurements (P and Q) as the input for the model. The accuracy of the prediction is greatly improved. Therefore, method B is used herein as the model decoupling technique for the EKF estimator. An example of the EKF estimator 200 is shown in FIG. 2, where the PMU data are separated into two groups (P and Q as estimation inputs and V and $\theta$ as measurements). The dynamics estimation section (or estimator) 203 performs prediction using the system equations, while the geometry estimation section (or estimator) 206 computes the estimated measurements based on the priori states. A Kalman filter gain 209 is used to correct the priori state with the error between the PMU measurements and their estimation. As shown in FIG. 2, estimations may be carried out for multiple locations.

The EKF estimator 200 may be implemented with processing circuitry. In various embodiments, the processing circuitry is implemented as at least a portion of a microprocessor. The processing circuitry and/or its components may be implemented using one or more circuits, one or more microprocessors, application specific integrated circuits, dedicated hardware, digital signal processors, microcomputers, central processing units, field programmable gate arrays, programmable logic devices, state machines, or any combination thereof. In yet other embodiments, the processing circuitry may include one or more software modules executable by one or more processing circuits. For example, the processing circuitry may include memory configured to store instructions and/or code that causes the processing circuitry to execute some or all of the functionality described herein.

A more detailed model of the EKF will now be discussed. The states and parameters to be estimated are the rotor angle ($\delta$), the rotor speed ($\omega$), the mechanical power ($P_m$), the inertia constant H, the damping factor D, and the transient reactance $x'_d$. The PMU can provide measurements for the terminal voltage magnitude ( ), voltage phase angle ($\theta$), real power (P), and reactive power (Q). The real and reactive powers are treated as inputs. The voltage magnitude and voltage phase angle are treated as outputs or measurements. The discrete model for the estimation system is described as follows:

$$\begin{cases} \delta_{k+1} = \delta_k + (\omega_k - 377)\Delta t + w_1 \\ \omega_{k+1} = \omega_k + \dfrac{377}{2H_k}(P_{m,k} - P_{e,k})\Delta t + D_k(\omega_k - 377)\Delta t + w_2 \\ P_{m,k+1} = P_{m,k} + w_3 \\ H_{k+1} = H_k + w_4 \\ D_{k+1} = D_k + w_5 \\ x'_{d,k+1} = x'_{d,k} + w_6 \end{cases}$$ (EQN. 9)

where $P_{e,k}$ is the input of the system and $w_i$ is the noise to represent un-modeled dynamics. Note that the Jacobian matrix A is constant for the above system model and is given by:

$$A = \begin{bmatrix} 1 & \Delta t & 0 & 0 & 0 & 0 \\ 0 & 1 - \dfrac{D\omega_0\Delta t}{2H} & \dfrac{\omega_0\Delta t}{2H} & A_{24} & A_{25} & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \end{bmatrix}$$ (EQN. 10)

where $$A_{24} = -\dfrac{P_m - P_e - D(\omega - \omega_0)}{2H^2}\omega_0\Delta t$$

$$A_{25} = \dfrac{-(\omega - \omega_0)}{2H}\omega_0\Delta t$$

The measurement sensitivity matrix H can be found from the implicit functions of EQN. 7.

$$H = \begin{bmatrix} \frac{\partial V}{\partial \delta} & \frac{\partial V}{\partial \omega} & \frac{\partial V}{\partial P_m} & \frac{\partial V}{\partial H} & \frac{\partial V}{\partial D} & \frac{\partial V}{\partial x'_d} \\ \frac{\partial \theta}{\partial \delta} & \frac{\partial \theta}{\partial \omega} & \frac{\partial \theta}{\partial P_m} & \frac{\partial \theta}{\partial H} & \frac{\partial \theta}{\partial D} & \frac{\partial \theta}{\partial x'_d} \end{bmatrix} \quad \text{(EQN. 11)}$$

$$= \begin{bmatrix} 0 & 0 & 0 & 0 & & \frac{\partial V}{\partial x'_d} \\ 1 & 0 & 0 & 0 & & \frac{\partial \theta}{\partial x'_d} \end{bmatrix}$$

The prediction step can be implemented in a straightforward fashion. The correction step, however, involves solving the implicit functions to find V and θ. This is a typical load flow problem. The Newton-Ralphson method can be employed to find ŷ numerically.

To speed up the estimation process, iterative EKF was adopted. For each time step, there was previously one prediction step and one update step. With an iterative EKF setup, for each time step, there will be iterations to update the Jacobian matrices and calculate the estimated measurements.

The EKF algorithm expands the measurement function $h_k$ in the correction stage around $x_{\bar{k}}$ obtained as the best estimation of x from the prediction phase:

$$h(x_k, u_k, v_k) = h(\hat{x}_{\bar{k}}, u_k, 0) + H(\hat{x}_k - x_{\bar{k}}) + v_k \quad \text{(EQN. 12)}$$

However, after the correction phase there is a better estimate of $x_k$ as $\hat{x}_k$. Using the after correction estimate $\hat{x}_k$ in EQN. 12 instead of $\hat{x}_{\bar{k}}$ can decease the linearization errors in the rest of the estimation process and improve the estimate $\hat{x}_k$ of the correction phase. The iterative extended Kalman filter (IEKF) is based on repeating the linearization of h and the correction phase on the improved estimate $\hat{x}_k^i$ where i is the number of the iteration.

Figure 3:
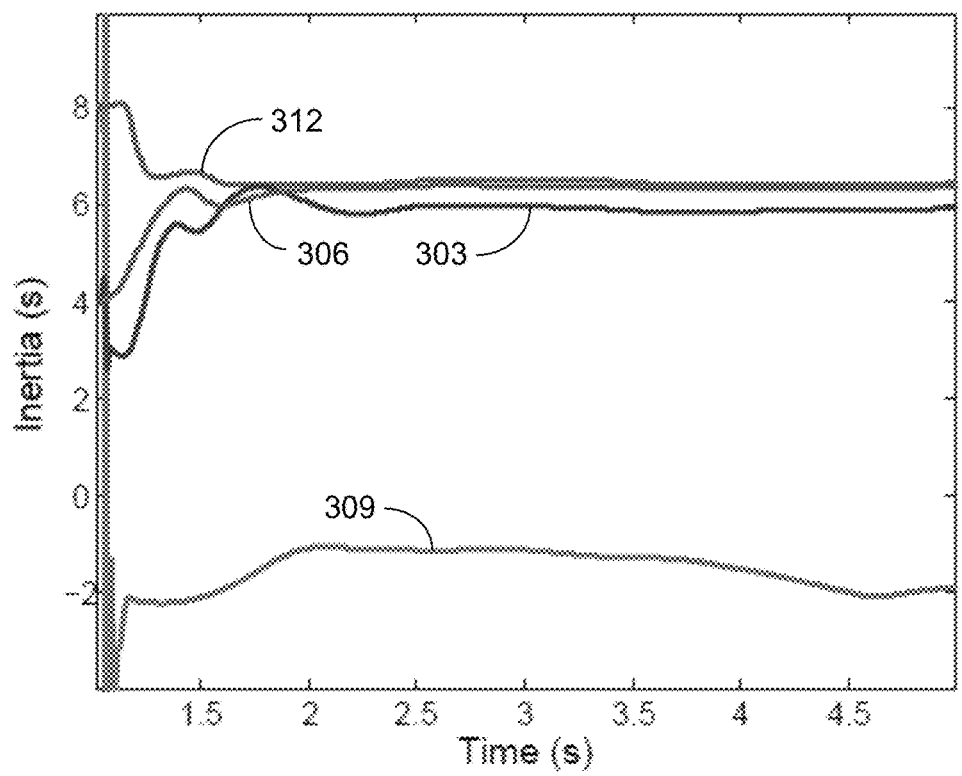
FIG. 3 is a plot of an example of estimating an inertia constant using EKF and iterative EKF in accordance with various embodiments of the present disclosure.

Referring to FIG. 3, shown is a plot illustrating an example of the processing improvement using IEKF over EKF for estimating the inertia constant (H) for set 1 of the case studies described below. The estimation results using IEKF and EKF were plotted for two initial estimates of H. Curve 303 corresponds to the EKF estimation and curve 306 corresponds to the IEKF estimation with an initial H of 4 pu·s. Curve 309 corresponds to the EKF estimation and curve 312 corresponds to the IEKF estimation with an initial H of 8 pu·s. For each step of IEKF, there were eight iterations ("itr=8") to update the estimated states. It was found that IEKF can significantly increase the convergence rate towards the accurate parameter. In both cases, IEKF found the accurate estimation within two seconds. In addition, it can be seen that IEKF estimations 306 and 312 converged to the accurate estimation independent of the initial estimate. In contrast, EKF did not reach an accurate estimation within ten seconds. Moreover, when the initial estimate was 8 pu·s, EKF provided an estimation of a negative number.

Case Studies

Figure 4:
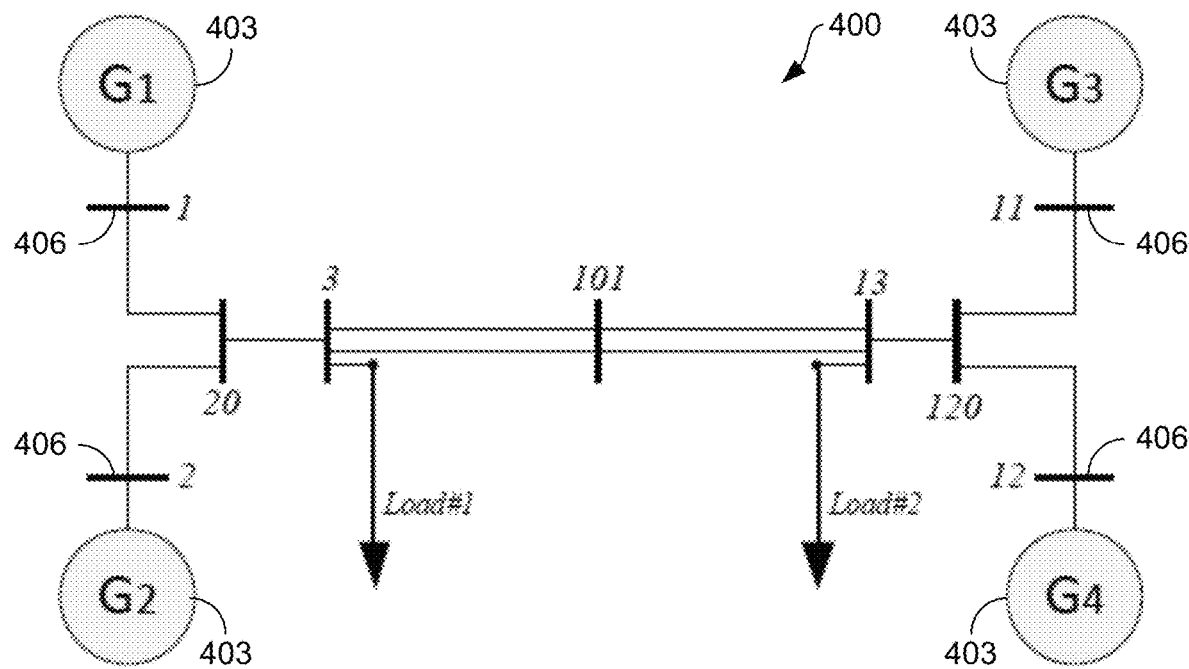
FIG. 4 is a graphical representation of a system used in case studies of EKF estimation in accordance with various embodiments of the present disclosure.

Referring next to FIG. 4, shown is an example of a classic two-area four-machine system 400 used to evaluate the EKF methods. The system 400 includes four generators 403 coupled to the distribution system via generator terminal buses 406. Voltage phasor data and current phasor data from a generator terminal bus were recorded. The sampling interval was 0.01 s. The recorded data was used to test the EKF methods for two-state/four-parameter and two-state/five-parameter estimation problems. Four sets of simulation data were recorded for the testing:

Set 1: In the first set, a classical generator model was used in the simulations. Hence, the Kalman filter dynamic model was exactly same as the physical model. The machine parameters were H=6.5 s, D=6 pu, x'$_d$=0.25 pu, E=1.08 pu, and P$_m$=0.85 pu.

Set 2: In the second set, the damping was reduced to zero in the swing equation.

Set 3: In the third set, a subtransient generator model was used. The damping factor was zero.

Set 4: In the fourth set, a subtransient generator model was used. The damping factor was 6. An automatic voltage regulator (AVR) was enabled to get a stable system response.

Figure 5:
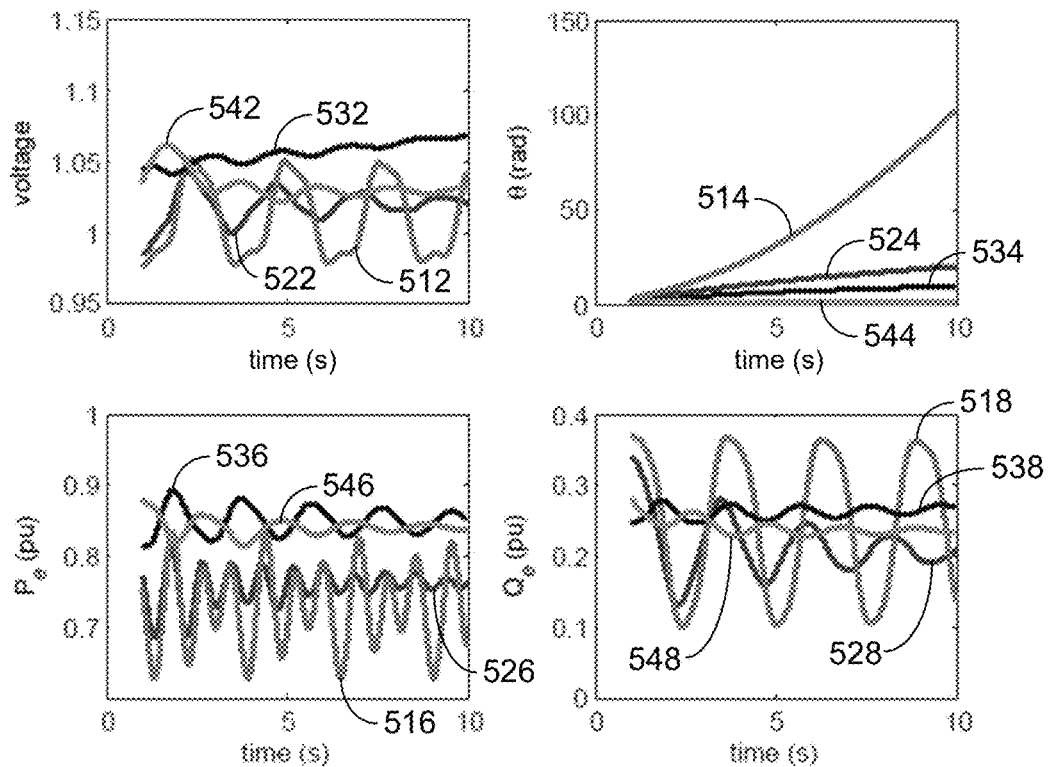
FIG. 5 includes plots of PMU measurements corresponding to four sets of case studies used to evaluate the EKF estimation in accordance with various embodiments of the present disclosure.

Estimation using EKF was carried out for two-states (δ and ω) and four-parameters (P$_m$, H, D and x'$_d$), as well as for two-states (δ and ω) and five-parameters (P$_m$, H, D, x'$_d$ and E). For the two-state and four-parameter estimation problem, sets 1-4 were used for the evaluation. For the two-state and five-parameter estimation problem, sets 1 and 4 were used. The measurement data (V, θ, P$_e$, Q$_e$) for the four sets were plotted as illustrated in FIG. 5. Curves 512, 514, 516 and 518 correspond to set 1, curves 522, 524, 526 and 528 correspond to set 2, curves 532, 534, 536 and 538 correspond to set 3, and curves 542, 544, 546 and 548 correspond to set 4. At least two initial estimates were used to evaluate the ability of EKF to converge to the same estimation value or not.

Estimation of Two States and Four Parameters

The co-variance matrix Q of the processing noise for sets 1 and 2 was different than the co-variance matrix Q for sets 3 and 4. Since sets 1 and 2 were simulation results based on a classical generator model and a fixed internal voltage, there were no unmodeled dynamics in H, D and x'$_d$. Hence Q$_{44}$, Q$_{55}$, and Q$_{66}$ were set to zero. On the other hand, sets 3 and 4 were simulation results based on a subtransient generator model. Because of this, it was reasonable to model the unmodeled dynamics as noise in w$_2$, w$_3$, w$_4$, w$_5$, and w$_6$. The initial co-variance matrix was set to reflect the error in the initial estimates. TABLE 1 documents the parameters used in EKF estimation.

TABLE 1

Covariance Matrices for Two-State Four-Parameter Estimation

| P | Sets 1 & 2 | Sets 3 & 4 | Q | Sets 1 & 2 | Sets 3 & 4 |
|---|---|---|---|---|---|
| P$_{11}$ | 1 | 1 | Q$_{11}$ | 10$^{-4}$ Δt | 10$^{-4}$ Δt |
| P$_{22}$ | 30 | 30 | Q$_{22}$ | 10$^{-3}$ Δt | 10$^{-3}$ Δt |
| P$_{33}$ | 0.1 | 0.1 | Q$_{33}$ | 0 | 0 |
| P$_{44}$ | 5 | 5 | Q$_{44}$ | 0 | 0 |
| P$_{55}$ | 50 | 50 | Q$_{55}$ | 0 | 0 |
| P$_{66}$ | 1 | 1 | Q$_{66}$ | 0 | 0.01 Δt |

Figure 6:
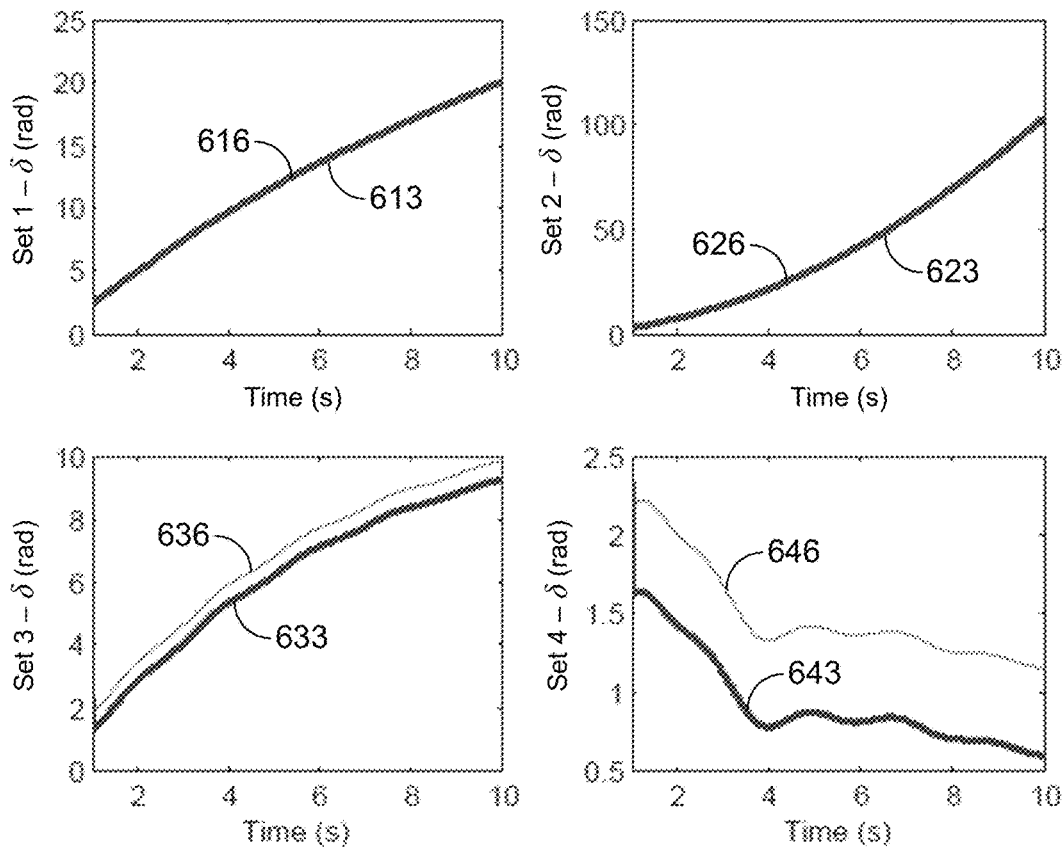
FIG. 6 includes plots of EKF estimated rotor angle (δ) compared to the simulated rotor angle for the four sets of case studies of FIG. 5 in accordance with various embodiments of the present disclosure.
Figure 7:
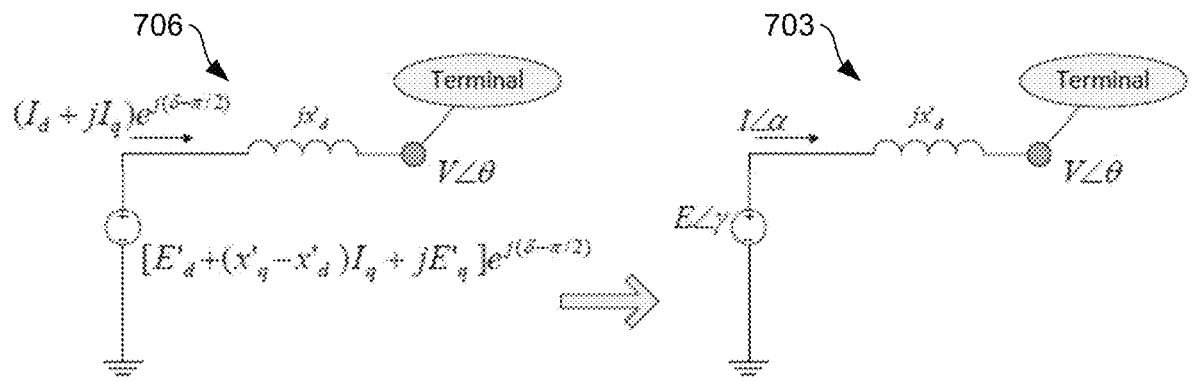
FIG. 7 is a graphical representation comparing a two-axis generator model with a classic generator model in accordance with various embodiments of the present disclosure.

Referring to FIG. 6, shown are comparisons of the estimated rotor angle to the simulated rotor angle for sets 1-4. Curves 613, 623, 633 and 643 correspond to the estimated rotor angle for sets 1-4, respectively, and curves 616, 626, 636 and 646 correspond to the simulated rotor angle for sets 1-4, respectively. The estimated rotor angle matched very well with the simulated rotor angle for sets 1 and 2. As shown in FIG. 6 for sets 3 and 4, there was a discrepancy between the estimation and the simulation values, though the dynamic trends tracked each other well.

The discrepancy for sets 3 and 4 may be explained by comparing the classical machine model 703 for the generator with a two-axis machine model 706 as illustrated in FIG.

7. With the voltage sources of the two models being equivalent, the classic model voltage source can be expressed by:

$$E = \sqrt{(E'^o_d + (x'_q - x'_d)I^o_q)^2 + (E'^o_q)^2} \quad \text{(EQN. 13)}$$

where $x'_d$ is the q axis transient reactance, and $E'^o_d$, $E'^o_q$, and $I'^o_q$ are the d and q axis components of the voltage source and the current during steady state.

It is noted that there is always a difference between the angle of the classical generator and the rotor angle ($\delta - \gamma = \delta'^o$). Therefore, there is a discrepancy ($\delta'^o$) between the estimated rotor angle and the simulated rotor angle when the simulation model is a subtransient generator model and the estimation model is a classical generator model. The discrepancy may be expressed as:

$$\delta'^o = \tan^{-1}\left(\frac{E'^o_q}{E'^o_d + (x'_q - x'_d)I^o_q}\right) - \pi/2 \quad \text{(EQN. 14)}$$

Figure 8:
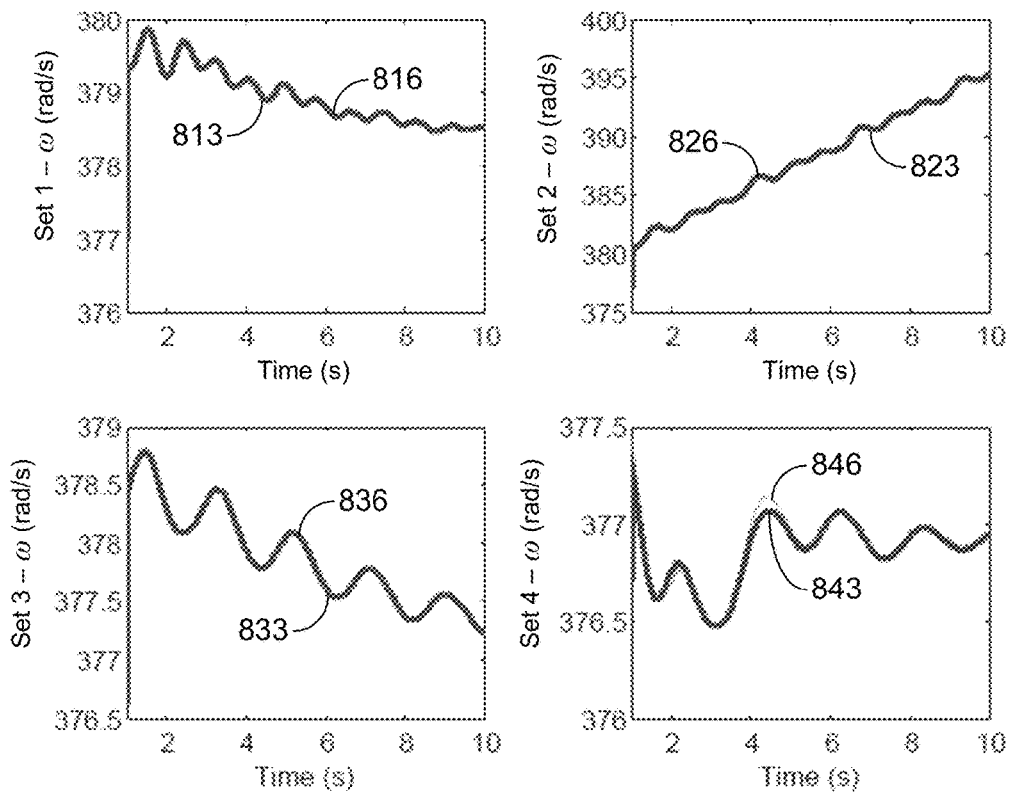
FIG. 8 is a plot comparing EKF estimated rotor speed (ω) with simulated rotor speed for the four sets of case studies of FIG. 5 in accordance with various embodiments of the present disclosure.
Figure 9:
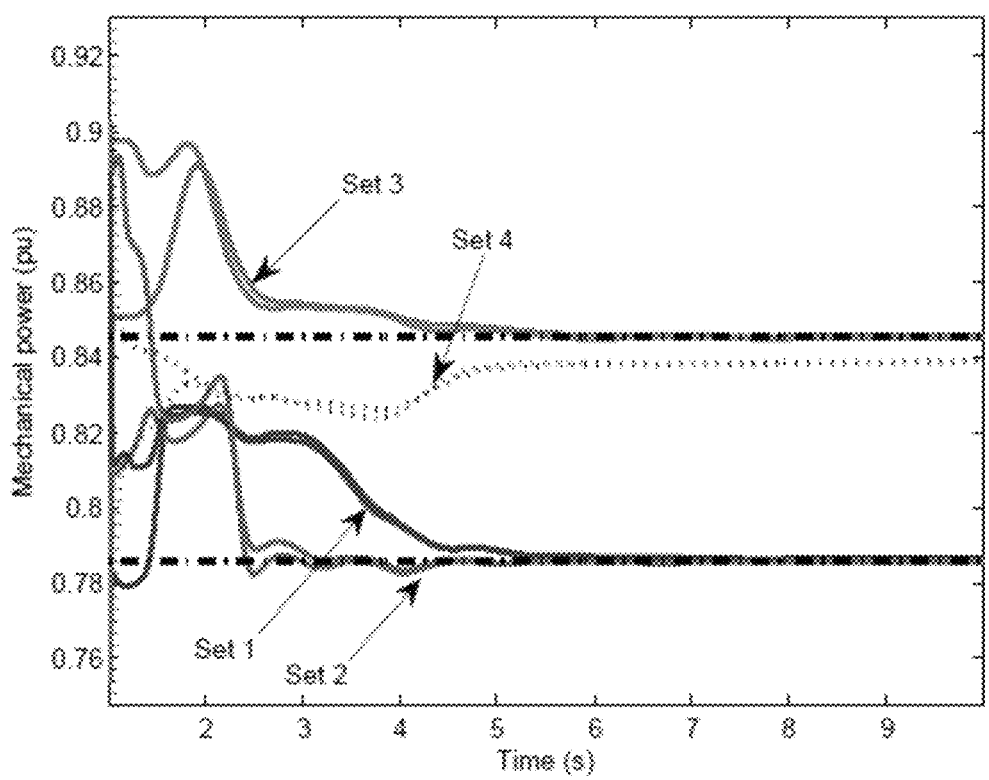
FIG. 9 is a plot comparing EKF estimated mechanical power ($P_m$) with simulated mechanical power for the four sets of case studies of FIG. 5 in accordance with various embodiments of the present disclosure.

The state ($\delta$ and $\omega$) and parameter ($P_m$, H, D and $x'_d$) results are shown in FIGS. 8-12. The rotor speed ($\omega$) estimates for cases 1-4 are shown in FIG. 8. Curves 813, 823, 833 and 843 correspond to the estimated $\omega$ for sets 1-4, respectively, and curves 816, 826, 836 and 846 correspond to the simulated $\omega$ for sets 1-4, respectively. FIGS. 9-12 provide plots of the parameter estimates for mechanical power ($P_m$), inertia constant (H), damping factor (D), and transient reactance ($x'_d$), respectively, for sets 1-4 as indicated. Simulated values are indicated by dashed lines.

Figure 10:
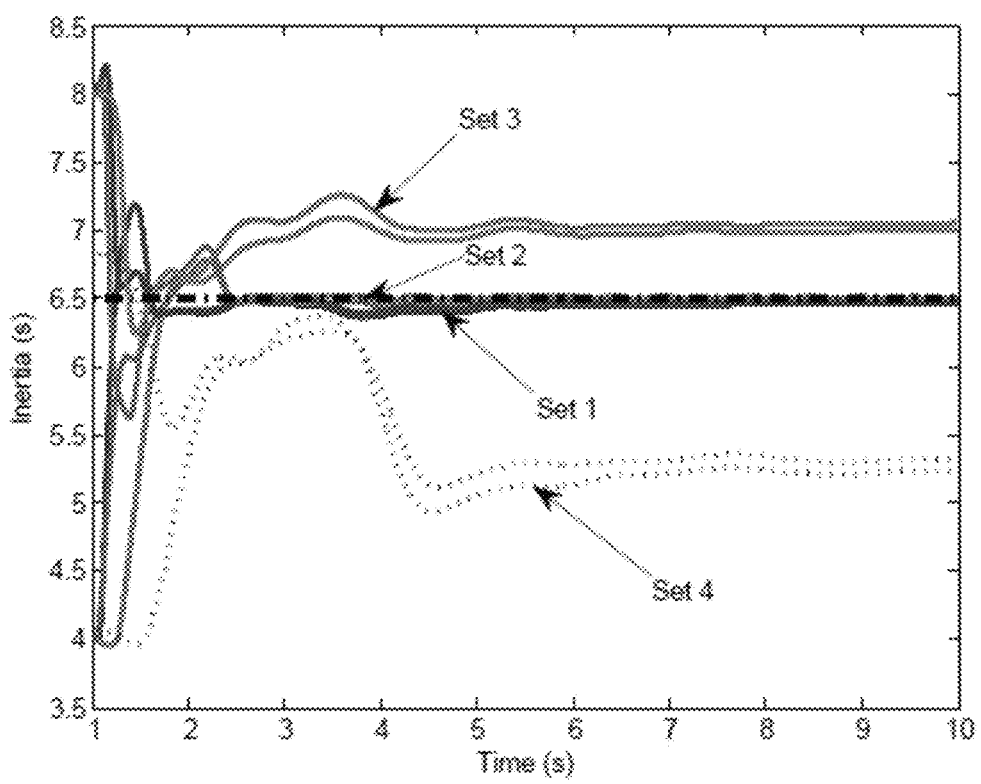
FIG. 10 is a plot comparing EKF estimated damping (D) with simulated damping factor for the four sets of case studies of FIG. 5 in accordance with various embodiments of the present disclosure.
Figure 11:
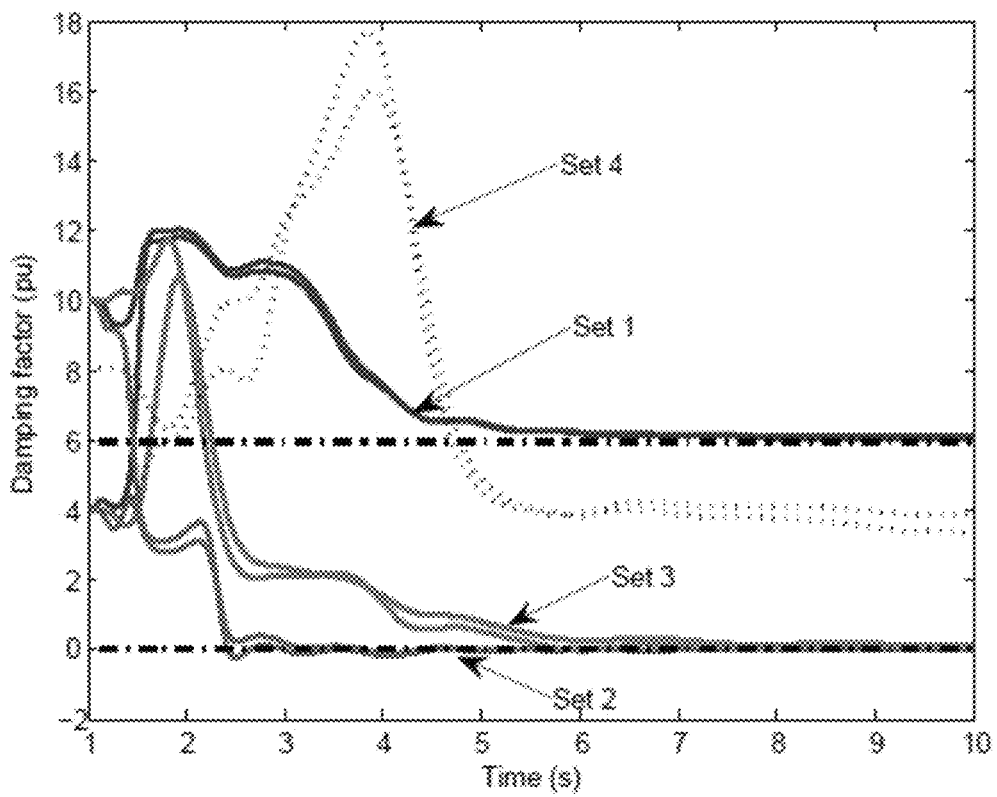
FIG. 11 is a plot comparing EKF estimated inertia constant (H) with a simulated inertia constant for the four sets of case studies of FIG. 5 in accordance with various embodiments of the present disclosure.
Figure 12:
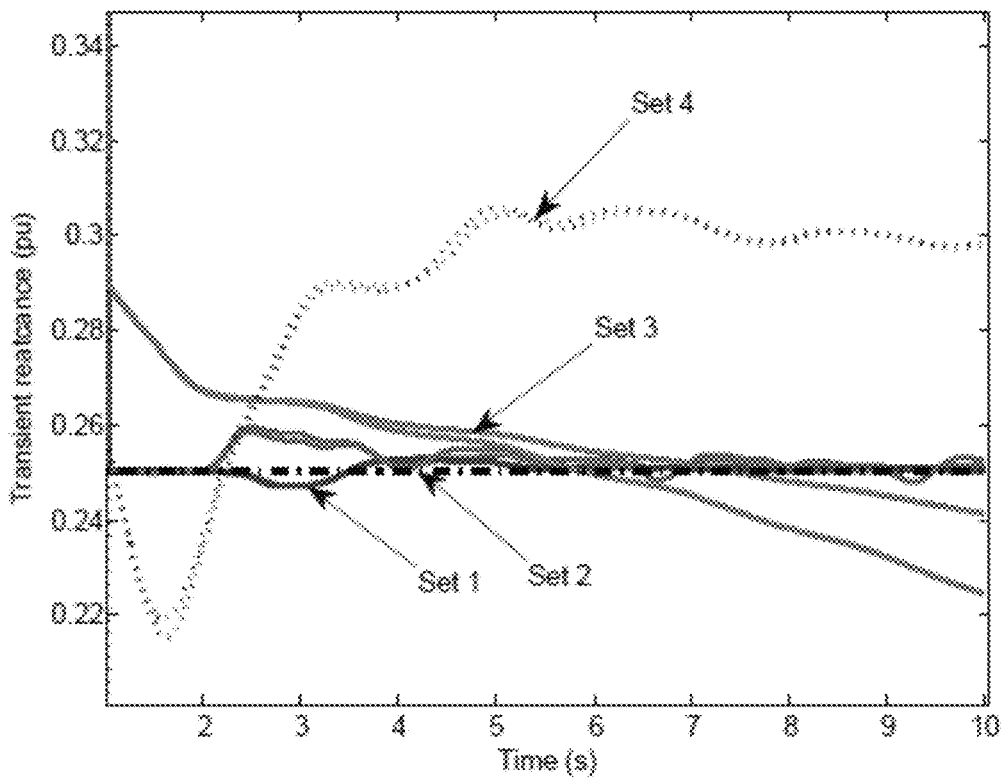
FIG. 12 is a plot comparing EKF estimated transient reactance ($x'_d$) with a simulated transient reactance for the four sets of case studies of FIG. 5 in accordance with various embodiments of the present disclosure.

Sets 1 and 2 utilized the classical generator model. The estimation of the rotor speed ($\omega$), the mechanical power ($P_m$), inertia constant (H), damping factor (D), and transient reactance ($x'_d$) using data from sets 1 and 2 were found to be good matches with the simulation results. Sets 3 and 4 utilized the subtransient generator model and excitation control was not modeled for set 3. As shown in FIG. 10, the estimation of H for set 3 was higher than the simulation value, while the estimation of H for set 4 was lower than the simulation value.

When the field voltage $E_{fd}$ is constant, the effect of the synchronous machine field circuit dynamics (such as, e.g., the field flux variations) causes a slight reduction in the synchronizing torque component and an increase in the damping torque component at the electromechanical oscillation modes. The linearized swing equation for a classical generator can be expressed as:

$$s^2(\Delta\delta) + \frac{D}{2H}s(\Delta\delta) + \frac{K_s}{2H}\omega_0(\Delta\delta) = \frac{\omega_0}{2H}\Delta P_m. \quad \text{(EQN. 15)}$$

where $$K_s = \frac{\partial P_s}{\partial \delta},$$

D is the damping torque component, and $K_s$ is the synchronizing torque component. Therefore, the characteristic equation is given by:

$$s^2 + \frac{D}{2H}s + \frac{K_s\omega_0}{2H} = 0 \quad \text{(EQN. 16)}$$

The effect of field flux variations will change the synchronizing torque component and the damping torque component and the characteristic equation becomes:

$$s^2 + \frac{DK_{fD}}{2H}s + \frac{K_sK_{fs}\omega_0}{2H} = 0 \quad \text{(EQN. 17)}$$

Or: $s^2 + \frac{D'}{2H'}s + \frac{K_s\omega_0}{2H'} = 0$ where $K_{fD} > 1$ (increase in the damping torque component), $K_{fs} < 1$ (reduction in the synchronizing torque component), $H' = H/K_{fs} > H$, and $D' = DK_{fD} = K_{fs} > D$. Therefore, it is reasonable for EKF-based estimation to find the estimated inertia and damping constant to be greater than the simulation values for set 3 data.

The excitation control's effect on damping and synchronizing torque components at the oscillation frequency depends on the gain of the AVR and the system operating condition. In the case study, a high gain was chosen, which introduces a positive synchronizing torque component and a negative damping torque component. Compared to the effect of machine circuit dynamics, the effect of the AVR is very significant. It can be found that H'<H and D'<D. Therefore, for set 4, it is reasonable that the estimated inertia constant (FIG. 10) and damping factor (FIG. 11) are less than the real values.

For the two-state four-parameter estimation problem, two initial estimates are used for each set. All parameter estimations converged, except for transient reactance ($x'_d$) for set 3, to the simulation values or close to the simulation values within 10 seconds. Therefore, the application of EKF can to provide converged and reasonable estimation of the generator parameters.

Estimation of Two States and Five Parameters

In the above description, four parameters were estimated along with the two states. Considered next is the estimation of two-states ($\delta$ and $\omega$) and five-parameters ($P_m$, H, D, $x'_d$ and E) using iterative EKF (IEKF). Two sets (1 and 4) of simulation data were used for the EKF estimation.

The co-variance matrix Q of the processing noise for set 1 was different than the co-variance matrix Q for set 4. Since set 1 was simulation results based on a classical generator model and a fixed internal voltage, there were no noise in $E_{k+1} = E_k$. Hence $Q_{787}$ was set to zero. On the other hand, set 4 was simulation results based on a subtransient generator model and there was no fixed internal voltage. Because of this, it was reasonable to write $E_{k+1} = E_k + w_7$ and the noise co-variance is set to 0.001 $\Delta$ t where $\Delta$ t is the sampling data time step. In addition, to make EKF's co-variance matrix P converge to zero as much as possible, the elements of P were also adjusted for the two different test data. TABLE 2 documents the parameters used in the EKF estimation. The four sets of initial estimates used for the EKF estimation of the state variables X are shown in TABLE 3.

TABLE 2

Covariance Matrices for Two-State Five-Parameter Estimation

| P | Set 1 | Set 4 | Q | Set 1 | Set 4 |
|---|---|---|---|---|---|
| $P_{11}$ | 1 | 10 | $Q_{11}$ | $10^{-6}$ $\Delta t$ | $10^{-6}$ $\Delta t$ |
| $P_{22}$ | 50 | 50 | $Q_{22}$ | $10^{-2}$ $\Delta t$ | $10^{-2}$ $\Delta t$ |
| $P_{33}$ | 1 | 1 | $Q_{33}$ | 0 | $10^{-6}$ $\Delta t$ |
| $P_{44}$ | 5 | 5 | $Q_{44}$ | 0 | $10^{-4}$ $\Delta t$ |
| $P_{55}$ | 100 | 50 | $Q_{55}$ | 0 | $10^{-4}$ $\Delta t$ |

TABLE 2-continued

Covariance Matrices for Two-State Five-Parameter Estimation

| P | Set 1 | Set 4 | Q | Set 1 | Set 4 |
|---|---|---|---|---|---|
| $P_{66}$ | 3 | 3 | $Q_{66}$ | 0 | $10^{-5} \Delta t$ |
| $P_{77}$ | 3 | 3 | $Q_{77}$ | 0 | $10^{-3} \Delta t$ |

TABLE 3

Initial Estimates of Parameters

| X | Case 1 | Case 2 | Case 3 | Case 4 |
|---|---|---|---|---|
| $X_1$ | 2.34 | 2.34 | 2.34 | 2.34 |
| $X_2$ | $\omega_0$ | $\omega_0$ | $\omega_0 t$ | $\omega_0$ |
| $X_3$ | 0.6 | 1 | 1 | 1 |
| $X_4$ | 8 | 4 | 4 | 8 |
| $X_5$ | 6 | 4 | 4 | 8 |
| $X_6$ | 0.3 | 0.1 | 0.2 | 0.4 |
| $X_7$ | 1.0878 | 1.0878 | 1.0878 | 1.1 |

Figure 13:
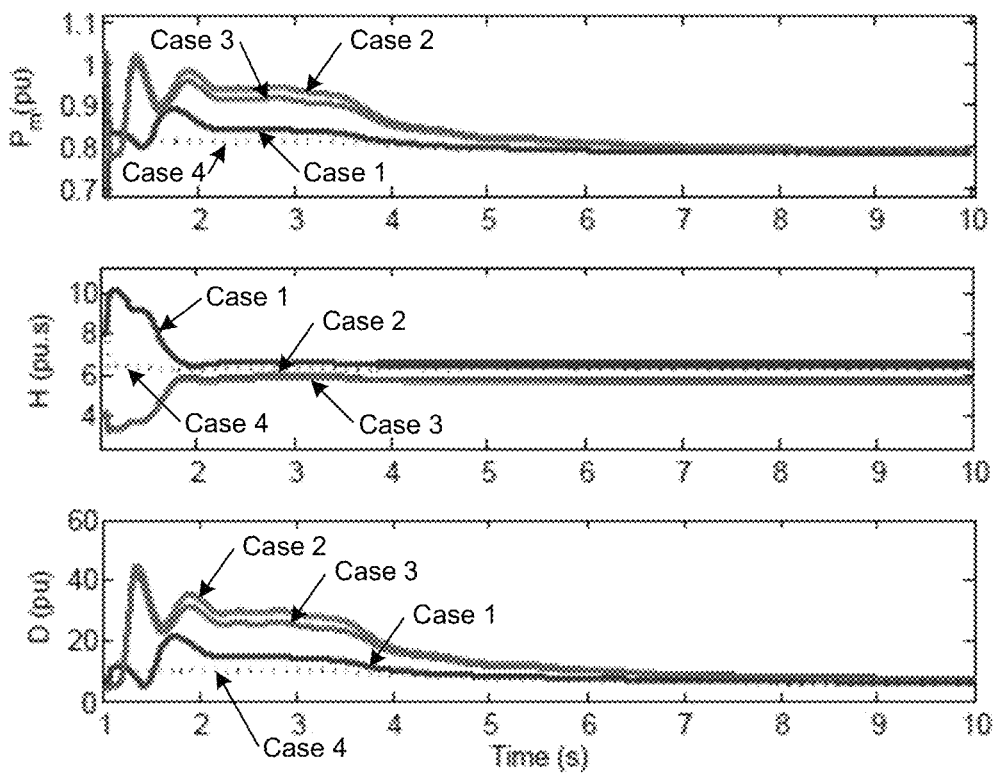
FIG. 13 is a plot of EKF estimated $P_m$, H and D using four different groups of initial estimates for set 1 of the case studies of FIG. 5 in accordance with various embodiments of the present disclosure.
Figure 14:
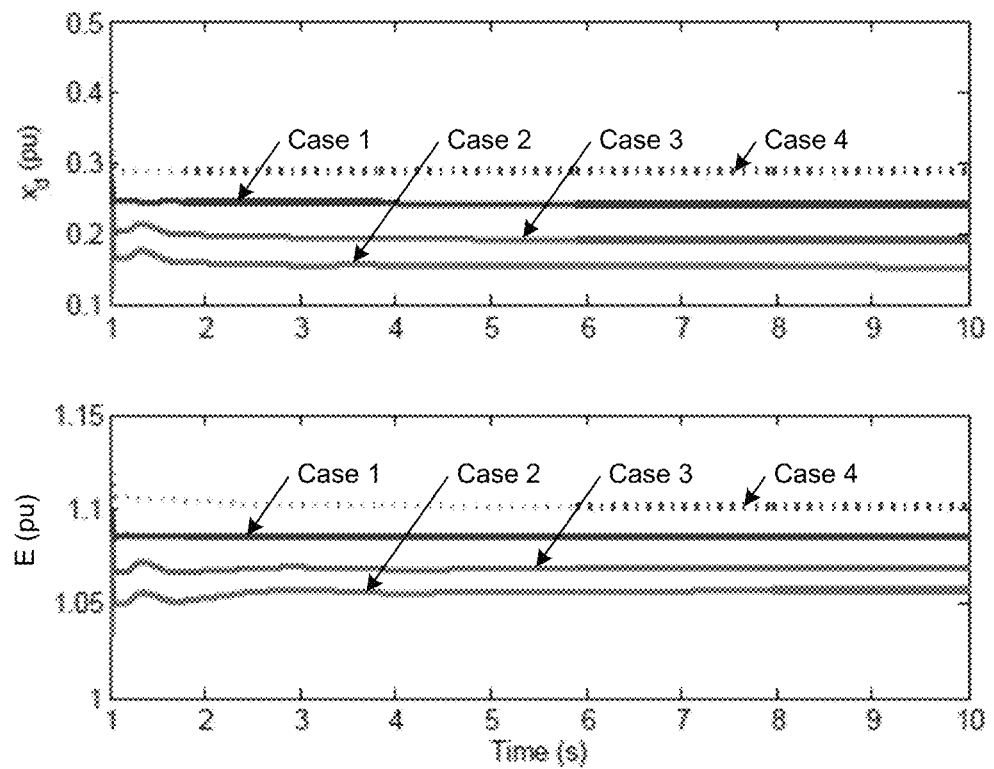
FIG. 14 is a plot of EKF estimated E and $x'_d$ using the four different groups of initial estimates of FIG. 13 for set 1 of the case studies of FIG. 5 in accordance with various embodiments of the present disclosure.
Figure 15:
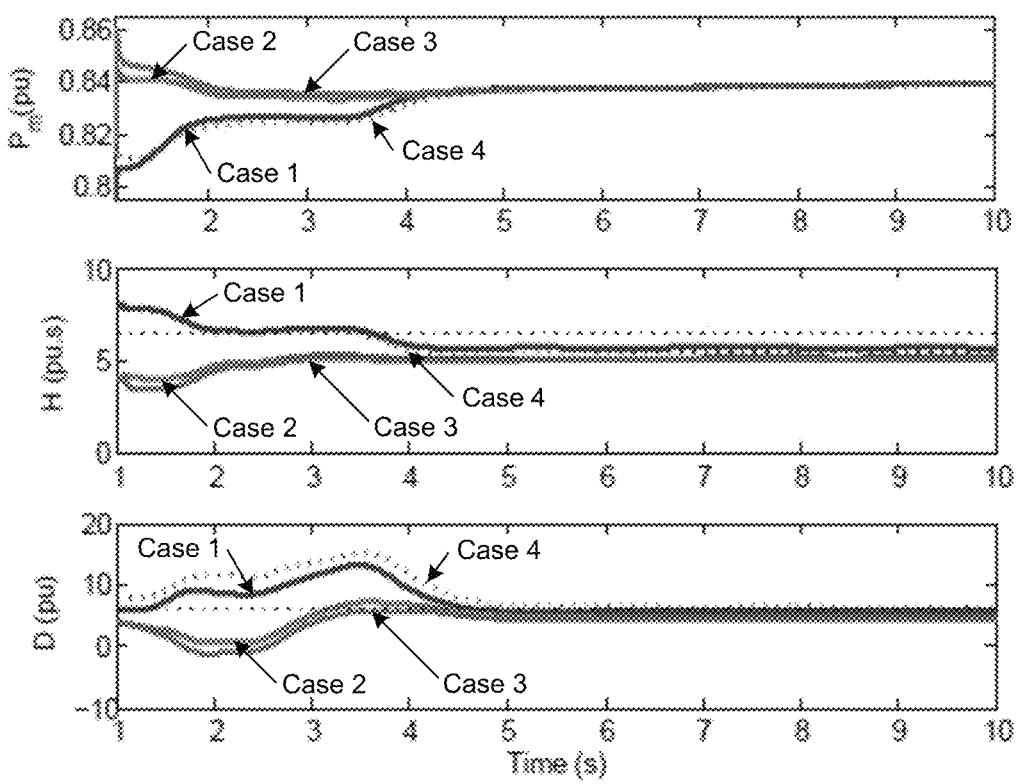
FIG. 15 is a plot of EKF estimated $P_m$, H and D using four different groups of initial estimates of FIG. 13 for set 4 of the case studies of FIG. 5 in accordance with various embodiments of the present disclosure.
Figure 16:
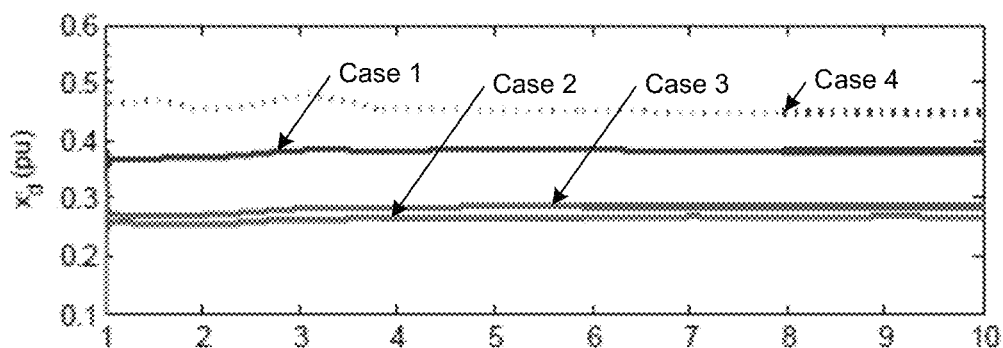
FIG. 16 is a plot of EKF estimated E and $x'_d$ using the four different groups of initial estimates of FIG. 13 for set 4 of the case studies of FIG. 5 in accordance with various embodiments of the present disclosure.
Figure 16:
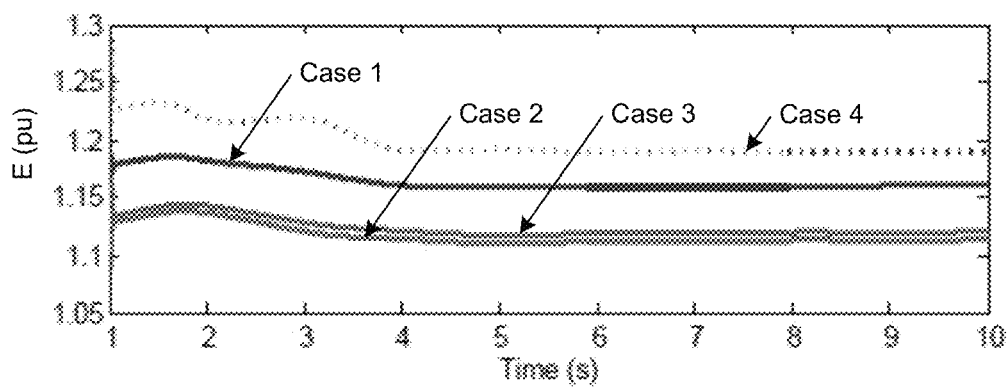

The estimation results for set 1 data are plotted in FIGS. 13 and 14 and the estimation results for set 4 data are plotted in FIGS. 15 and 16.

From both cases, it was found that, when estimating the additional parameter E, EKF will reach different sets of E and $x'_d$ with different initial estimated states. A review of the co-variance matrix revealed that the covariance matrix elements approached zero, indicating that the EKF was converging. An explanation may be offered by examining the power equations of EQN. 7. Given P, Q, V and θ, and the two equations of EQN. 7, two unknowns among E, δ, and $x'_d$ can be found with unique answers. If three variables are to be solved at the same time, the solutions are not unique. Therefore, for the EKF estimator discussed in this disclosure, when a second-order swing equation and a classical generator model are used to describe the system, four parameters may be effectively estimated.

In this disclosure, EKF-based dynamic state and parameter estimation using a model decoupling technique was described. The technique can be used to perform real-time dynamic estimation for subsystems using PMU data where the real and reactive power are treated as an input to the EKF estimator and the voltage and phase angle are treated as the output from the EKF estimator. Based upon a classical generator model, the disclosed EKF estimation can successfully estimate the states and parameters related to electromechanical dynamics of generators while connected to a power system.

Figure 17:
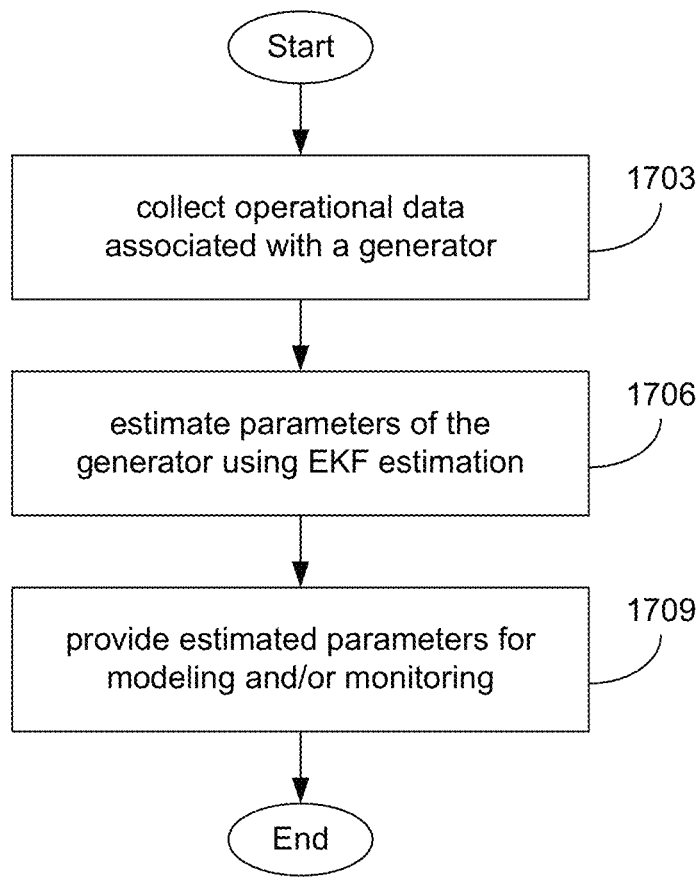
FIG. 17 is flowchart illustrating an example of EKF estimation in accordance with various embodiments of the present disclosure.

Referring to FIG. 17, shown is flowchart illustrating an example of EKF estimation of generator parameters in accordance with various embodiments of the present disclosure. Beginning with 1703, data associated with a generator is collected. The data includes operational data such as, e.g., real-time data associated with the generator. The data may be measured by a phasor management unit (PMU). For example, the PMU may be coupled to a generator terminal bus at the output of the generator. The data measured during operation of the generator by the PMU can include, e.g., voltage magnitude (V), voltage phase angle (θ), real power (P) and/or reactive power (Q). In this way, the data may be collected for estimation of one or more parameter and/or state associated with the generator.

In 1706, parameters of the generator are estimated using EKF estimation. The EKF estimation may be carried out as illustrated in FIG. 2 and discussed above. A portion of the measured data (e.g., P and Q) may be delayed and used to estimate one or more priori variable(s) (one or more state and/or parameter) associated with the generator. The estimated priori variable(s) may then be used to estimate another portion of the measured data. For example, measured phasor values such as, e.g., V and θ may be estimated. The portion of the measured data (e.g., P and Q) may also be used to estimate the other portion of the measured data (e.g., V and θ). The error between the estimated and measured data may then be used to correct the estimated priori variable(s) to provide the estimated parameters. In this way, the parameters associated with the generator may be dynamically estimated. In 1709, the estimated parameters may be provided for generator modeling or for other applications such as, e.g., real-time monitoring of the generator and/or power system conditions.

Figure 18:
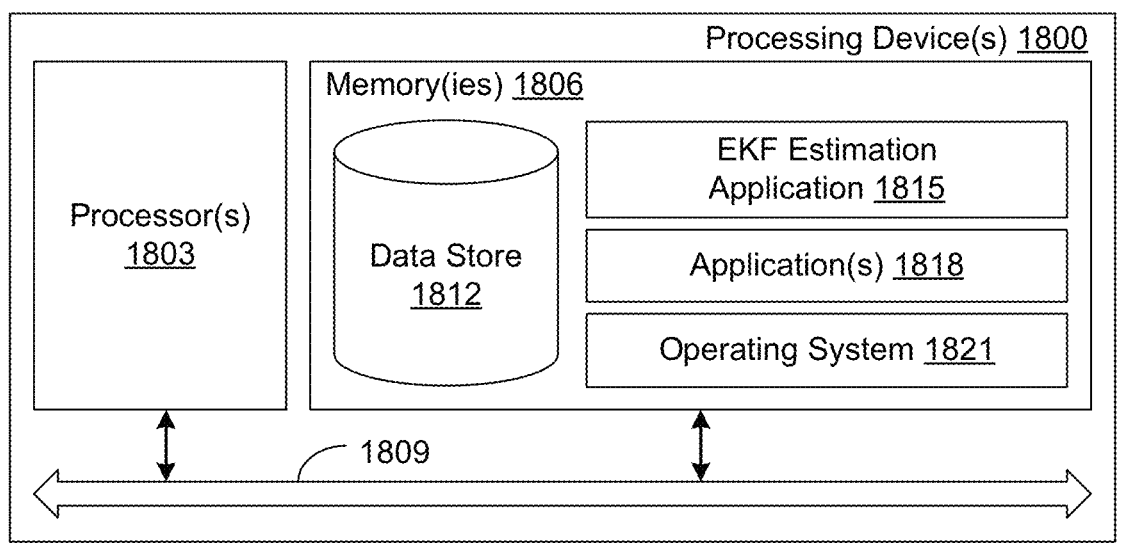
FIG. 18 is a schematic diagram of a processing device in accordance with various embodiments of the present disclosure.

With reference to FIG. 18, shown is a schematic diagram of a processing device 1800 according to various embodiments of the present disclosure. The processing device 1800 includes at least one processor circuit, for example, having a processor 1803 and a memory 1806, both of which are coupled to a local interface 1809. To this end, the processing device 1800 may comprise, for example, at least one server computer or like device. The local interface 1809 may comprise, for example, a data bus with an accompanying address/control bus or other bus structure as can be appreciated.

Stored in the memory 1806 are both data and several components that are executable by the processor 1803. In particular, stored in the memory 1806 and executable by the processor 1803 may be an EKF estimation application 1815 and/or other applications 1818. Also stored in the memory 1806 may be a data store 1812 and other data. In addition, an operating system may be stored in the memory 1806 and executable by the processor 1803.

It is understood that there may be other applications that are stored in the memory 1806 and are executable by the processor 1803 as can be appreciated. Where any component discussed herein is implemented in the form of software, any one of a number of programming languages may be employed such as, for example, PlACE system, C, C++, C#, Objective C, Java®, JavaScript®, Perl, PHP, Visual Basic®, Python®, Ruby, Delphi®, Flash®, or other programming languages.

A number of software components are stored in the memory 1806 and are executable by the processor 1803. In this respect, the term "executable" means a program file that is in a form that can ultimately be run by the processor 1803. Examples of executable programs may be, for example, a compiled program that can be translated into machine code in a format that can be loaded into a random access portion of the memory 1806 and run by the processor 1803, source code that may be expressed in proper format such as object code that is capable of being loaded into a random access portion of the memory 1806 and executed by the processor 1803, or source code that may be interpreted by another executable program to generate instructions in a random access portion of the memory 1806 to be executed by the processor 1803, etc. An executable program may be stored in any portion or component of the memory 1806 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 1806 is defined herein as including both volatile and nonvolatile memory and data storage components. Volatile components are those that do not retain data values upon loss of power. Nonvolatile components are those that retain data upon a loss of power. Thus, the memory 1806 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 1803 may represent multiple processors 1803 and the memory 1806 may represent multiple memories 1806 that operate in parallel processing circuits, respectively. In such a case, the local interface 1809 may be an appropriate network that facilitates communication between any two of the multiple processors 1803, between any processor v03 and any of the memories 1806, or between any two of the memories 1806, etc. The local interface 1809 may comprise additional systems designed to coordinate this communication, including, for example, performing load balancing. The processor 1803 may be of electrical or of some other available construction.

Although the EKF estimation application 1815, application(s) 1818, and other various systems described herein may be embodied in software or code executed by general purpose hardware as discussed above, as an alternative the same may also be embodied in dedicated hardware, firmware or a combination of software/general purpose hardware, firmware and/or dedicated hardware. If embodied in dedicated hardware, each can be implemented as processing circuitry or a state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein.

Although the flowchart of FIG. 17 shows a specific order of execution, it is understood that the order of execution may differ from that which is depicted. For example, the order of execution of two or more blocks may be scrambled relative to the order shown. Also, two or more blocks shown in succession in FIG. 17 may be executed concurrently or with partial concurrence. Further, in some embodiments, one or more of the blocks shown in FIG. 17 may be skipped or omitted (in favor, e.g., measured travel times). In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including the EKF estimation application 1815 and/or application(s) 1818, that comprises software or code can be embodied in any non-transitory computer-readable medium for use by or in connection with an instruction execution system such as, for example, a processor 1803 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. An extended Kalman filtering estimator for a real-time generator control adjustment, the extended Kalman filtering estimator comprising a non-transitory computer-readable medium comprising executable instructions, wherein when executed by at least one processor, the instructions cause at least one computing device to at least:
    output an estimated real-time dynamic rotor state of a generator, based at least in part upon a measured real power and a measured reactive power that are measured by a phasor management unit (PMU) connected to the generator and provided as inputs;

calculate an estimated voltage and an estimated phase angle of the generator based at least in part upon the estimated real-time dynamic rotor state;

determine, based on extended Kalman filtering, a correction for the estimated real-time dynamic rotor state based at least in part upon a comparison of the estimated voltage and the estimated phase angle, with a measured voltage and a measured phase angle, the measured voltage and the measured phase angle being measured by the PMU; and provide the real-time generator control adjustment to an oscillation damping controller of the generator.

2. The extended Kalman filtering estimator of claim 1, wherein a corrected dynamic rotor state is determined based on the correction for the estimated real-time dynamic rotor state.

3. The extended Kalman filtering estimator of claim 2, wherein the estimated voltage and the estimated phase angle are updated based on the corrected dynamic rotor state.

4. The extended Kalman filtering estimator of claim 3, wherein the measured voltage and the measured phase angle are measured at a generator terminal bus.

5. The extended Kalman filtering estimator of claim 1, wherein the measured real power is a priori real power measurement and the measured reactive power is a priori reactive power measurement.

6. The extended Kalman filtering estimator of claim 5, wherein iterative extended Kalman filtering is performed by iterative operation.

7. The extended Kalman filtering estimator of claim 1, wherein the estimated voltage and the estimated phase angle are calculated and compared to the measured voltage and the measured phase angle in real time.

8. The extended Kalman filtering estimator of claim 1, wherein when executed, the instructions further cause the at least one computing device to at least output generator parameters comprising at least one of: an estimated mechanical power, an estimated interia constant, an estimated damping factor, an estimated transient reactance, and an estimated field voltage.

9. The extended Kalman filtering estimator of claim 1, wherein when executed, the instructions further cause the at least one computing device to at least output estimated real-time dynamic rotor states comprising an estimated rotor speed and an estimated rotor angle.

10. A system, comprising:
a computing device comprising at least one processor; and
a memory storing executable instructions for generator control adjustment, wherein when executed by the at least one processor, the instructions cause the computing device to at least:
determine output an estimated real-time transient reactance of a generator based at least in part upon inputs comprising a measured real power and a measured reactive power, the measured real power and the measured reactive power being measured by a phasor management unit (PMU) connected to the generator;
calculate an estimated voltage and an estimated phase angle of the generator based at least in part on the estimated real-time transient reactance;
determine, based on extended Kalman filtering, a correction for the estimated real-time transient reactance based upon a comparison of the estimated voltage and the estimated phase angle, with a measured voltage and a measured phase angle, the measured voltage and the measured phase angle being measured by the PMU; and provide a real time control signal to an oscillation damping controller of the generator to adjust the generator.

11. The system of claim 10, wherein a corrected transient reactance is determined based on the correction for the estimated real-time transient reactance.

12. The system of claim 11, wherein the estimated voltage and the estimated phase angle are updated based on the corrected transient reactance.

13. The system of claim 10, wherein the measured real power and the measured reactive power are delayed inputs.

14. The system of claim 10, wherein iterative extended Kalman filtering is performed by iteratively correcting the estimated real-time transient reactance during a single time step.

15. The system of claim 10, wherein the PMU measures the measured voltage and measured phase angle at a generator terminal bus.

16. The system of claim 10, wherein the estimated voltage and the estimated phase angle are calculated and compared to the measured voltage and the measured phase angle in real time.

17. An extended Kalman filtering estimator device for real-time generator control adjustment, the extended Kalman filtering estimator device comprising at least one processor and at least one memory comprising executable instructions, wherein the instructions, when executed by the at least one processor, cause the extended Kalman filtering estimator device to at least:
output an estimated real-time transient reactance of a generator, based at least in part upon a measured voltage and a measured phase angle that are measured phase angle being measured by a phasor management unit (PMU) connected to the generator and provided as inputs;
calculate an estimated real power and an estimated reactive power of the generator based at least in part upon the estimated real-time transient reactance;
determine, based on extended Kalman filtering, a correction for the estimated real-time transient reactance based at least in part upon a comparison of the estimated real power and the estimated reactive power, with a measured real power and a measured reactive power, the measured voltage and the measured phase angle being measured by the PMU; and
provide a control signal to an oscillation damping controller of the generator to adjust the generator in real time.

18. The extended Kalman filtering estimator device of claim 17, wherein a corrected transient reactance is determined based on the correction for the estimated real-time transient reactance.

19. The extended Kalman filtering estimator device of claim 18, wherein the estimated real power and the estimated reactive power are updated based on the corrected transient reactance.

20. The extended Kalman filtering estimator device of claim 17, wherein the measured voltage is a priori voltage measurement, and the measured phase angle is a priori phase angle measurement.

* * * * *